United States Patent
Fernihough et al.

(10) Patent No.: US 6,440,238 B1
(45) Date of Patent: Aug. 27, 2002

(54) PROCESS FOR TREATING THE SURFACE OF A COMPONENT, MADE FROM A NI BASED SUPERALLOY, TO BE COATED

(75) Inventors: John Fernihough, Ennetbaden; Andreas Bogli, Wettingen; Christoph Tonnes, Brugg, all of (CH)

(73) Assignee: Alstom (Switzerland) Ltd, Baden (CH)

( * ) Notice: Subject to any disclaimer, the term of this patent is extended or adjusted under 35 U.S.C. 154(b) by 0 days.

(21) Appl. No.: 09/632,797

(22) Filed: Aug. 4, 2000

(30) Foreign Application Priority Data

Aug. 9, 1999 (EP) .............................. 99810713

(51) Int. Cl.$^7$ .............................. C22F 1/10; B05D 3/00
(52) U.S. Cl. .................. 148/675; 148/537; 228/206; 427/328
(58) Field of Search ................................ 148/537, 675; 134/2, 19, 31; 228/206; 427/327, 328

(56) References Cited

U.S. PATENT DOCUMENTS 3,904,382 A * 9/1975 Beltran et al. ................. 29/194
5,071,486 A 12/1991 Chasteen
5,598,968 A 2/1997 Schaeffer et al.

FOREIGN PATENT DOCUMENTS

| EP | 0298309 A1 | 1/1989 |
| EP | 0813930 A2 | 12/1997 |
| FR | 2380354 | 9/1978 |

* cited by examiner

Primary Examiner—Roy King
Assistant Examiner—Harry D. Wilkins, III
(74) Attorney, Agent, or Firm—Burns, Doane, Swecker & Mathis, L.L.P.

(57) ABSTRACT

A process for treating the surface of a component prior to coating. The component is made from a Ni based superalloy designed for high temperature service. Both the component and the coating include the elements Al and/or Cr. The process includes depleting the outer surface of the component of any one or a combination of Al, Ti or Cr and thereafter applying the coating directly on the depleted surface. The process minimizes the formation of a brittle gamma prime phase within the interdiffusion zone during service of the component. The process can also be used to renew old damaged coatings.

14 Claims, No Drawings

PROCESS FOR TREATING THE SURFACE OF A COMPONENT, MADE FROM A NI BASED SUPERALLOY, TO BE COATED

This application claims priority under 35 U.S.C. §§119 and/or 365 to Appln. Ser. No. 99810713.0 filed in Europe on Aug. 9, 1999; the entire content of which is hereby incorporated by reference.

FIELD OF INVENTION

The invention relates to a process for treating the surface of a component prior to coating, wherein the component is made from a Ni based superalloy and designed for high temperature service, e.g. components for gas turbine engines, and the coating and the component both include the elements Al and/or Cr. The method can also be used for replacing the coating of a used component.

STATE OF THE ART

Components designed for high temperature use, e.g. blades or vanes of a gas turbine, are usually coated with corrosion and oxidation resistant coatings. The coating protects the base material against corrosion and oxidation due to the thermal effect of the hot environment and consists of an alloy mainly of the elements Al and Cr, e.g. MCrAlY. During operation of the component, the coating is slowly oxidized and/or corroded away, and at some point in time is either completely removed or reaches a minimum design limit which is no longer suitable for continued operation.

Components subject to coating wear and/or other damage during service are removed from service at regular intervals for repair and/or reconditioning during which any residual coating is stripped, various repairs are made, and a new coating applied. In addition, it is possible that new components are improperly coated during manufacturing and must have the coating stripped in order for an acceptable quality coating to be applied.

In the past, coatings with a higher Al content were used to provide higher oxidation resistance at increased temperatures. As a base material, a superalloy such as a Ni based superalloy was often used. Such a Ni based superalloy is disclosed in U.S. Pat. No. 5,759,301. A problem occurs due to the fact that the content of Al and Cr is significantly higher in the coating than in the base material. As a result, an undesired intermetallic phase (gamma prime $Ni_3Al$) occurs between the coating and the base material.

Ni based superalloys are typically heat treated so as to precipitate cubic gamma prime particles surrounded by a softer gamma matrix. At very high volume fractions, the gamma prime phase tends to form in continuous rafts or bands which offer much reduced resistance to crack growth and creep compared to the dispersed condition mentioned above. Further, overheating during service of Ni based superalloy components can lead to rafting of gamma prime into semicontinuous bands even at the normal gamma prime volume fractions of these superalloys. Components exhibiting this microstructure are unsuitable for further service because of the weakening effects of the gamma prime rafts.

When a typical MCrAlY coating is applied to the surface of a component made from a Ni base alloy, a diffusion heat treatment is normally required in order to ensure a high quality bond between coating and base material. During the heat treatment and subsequent operation of the component at high temperatures, Al and Cr from the coating diffuse into the surface of the base material forming an "interdiffusion zone" in which continuous bands of gamma prime often precipitate. The gamma prime bands form primarily due to the enrichment of the "interdiffusion zone" with Al which directly contributes to $Ni_3Al$ formation, and also due to the presence of Cr which increases the thermodynamic activity of Al. The "interdiffusion zone" after extended time in service can extend up to approximately 200 μm into the component beyond the coating/component-interface.

It is understood that very often the cracks leading to coating spallation occur not in the base-material/coating interface itself but in the brittle interdiffusion zone, along the gamma prime bands. This effect has been recognized in U.S. Pat. No. 5,556,713, which discloses a diffusion barrier formed by ion implantation of Re atoms onto the surface of the base material before coating. The purpose of the diffusion barrier is to stop the harmful diffusion of Al and Cr into the base material and, consequently, the formation of brittle continuous bands of gamma prime.

This effect is also indirectly recognized by U.S. Pat. No. 5,728,227 where a method for removing a diffusion coating from a nickel based alloy is disclosed. This method involves mechanically removing the outer coating to expose the diffused inner coating portion or "interdiffusion zone" and by depleting the extra Al in the exposed surface layer. The component may have been used in service, or may simply have been improperly coated and in need of a repair coating. According to the '227 patent, the method can be considered to reverse the prior diffusion of Al into the surface portion from a previously applied coating. The '227 patent applies only to previously coated or service run components.

Furthermore, the mechanical removal means disclosed in the '227 patent may impart considerable residual stresses to the component surface. While this is not of great concern for components manufactured with an equiaxed grain structure, components with a directionally solidified structure (columnar grains or single crystal) are extremely prone to recrystallization from such residual stresses if heat treated to regenerate a desired distribution of gamma prime. Recrystallization in such components profoundly decreases their resistance to failure under creep and cyclic loading, and usually results in their being scrapped. This problem has been recognized in U.S. Pat. No. 5,598,968, in which a solution for the recrystallization problem is presented by causing a precipitation of carbides in the surface layers of the component. However, the carbide precipitation requires an expensive and time consuming heat treatment and ultimately alters the originally intended composition and structure of the base alloy of the component.

The current state of the art for preparing previously coated parts is to strip the coating off the part either mechanically or chemically, clean the surface by various means, including transfer arc cleaning, and re-coat. U.S. Pat. No. 5,728,227 discloses mechanical stripping. Although mechanical stripping is advantageous for parts (e.g. in aeroengines) which are destined to undergo several re-coating operations during their service lives, there is little advantage for those parts which will only be subject to two or three such re-coating operations and, in particular, no advantage for newly coated parts with defective coatings in need of repair. Such newly coated parts would have a very small interdiffusion zone.

As for new components, apart from exotic solutions to the diffusion zone problem such as the diffusion boundary layer, the established art on surface preparation before coating discloses surface cleaning operations such as grit blasting, surface grinding, etching and/or transfer arc cleaning. However, all of these processes are only designed to remove unwanted inclusions or contaminants from the surface of the component, and have no significant effect on the chemical composition of the surface layer. No other methods are given which would avoid the formation of the brittle interdiffusion zone.

SUMMARY OF THE INVENTION

It is the aim of the present invention to overcome these disadvantages. The invention provides a process of treating the surface of a component designed for high temperature service e.g., a Ni based superalloy, prior to coating to prevent an interdiffusion zone between component and coating. The method can also be used for repairing an already coated component.

In the present invention, a component designed for high temperature service, e.g., a Ni based superalloy, is prepared for coating by depleting the outer surface of the component of any one or a combination of Al, Cr and Ti and applying the coating directly onto the depleted surface.

The advantage of the process is that the creation of a layer depleted of Al and/or Ti and/or Cr in the base material of a newly manufactured part before coating impedes the formation of a continuous layer of gamma prime even when Al and Cr diffuse into the component during the diffusion heat treatment after coating, or during the subsequent operation of the component at elevated temperatures. The surface of the component is preferably depleted of any one or a combination of Al, Cr and Ti to a depth up to 500 μm, with a preferred depth range of 20 μm up to 200 μm.

The process can also be used for an already coated component, such as a component whose coating was damaged by thermal impact during service. In this case, both the coating and an existing "interdiffussion zone" between the coating and the base material are removed by any means, e.g., mechanical or chemical, prior to treatment.

DESCRIPTION OF PREFERRED EMBODIMENT

The invention relates to a process of preparing a high temperature component for coating. These components can be used, for example, as blades or vanes in gas turbines. Normally these components consist of a base material with a coating. As a base material a Ni based superalloy is often used. As a thermal barrier coating, MCrAlY or a similar alloy may be used.

The creation of a layer depleted of Al and/or Ti and/or Cr on the outer surface of the base material of a newly manufactured component before coating impedes the formation of a continuous layer of gamma prime even when Al and Cr diffuse into the component during a diffusion heat treatment after coating, or during the subsequent operation of the component at elevated temperatures. The present process includes depleting the surface of the component of any one or a combination of Al, Cr and Ti up to a depth of 500 μm, with a preferred depth of 20 μm to 200 μm.

The depletion of the elements can be accomplished by a cleaning process which exposes reactive ions such as fluoride to the component surface. Known cleaning processes include for example, the Dayton process. Such depletion processes are described, for example, in EP Patent Publication No. 34 041 B2 and U.S. Pat. No. 4,188,237. A process for removing oxides from the surface of a superalloy, which is disclosed in U.S. Pat. Nos. 4,405,379 and 4,098,450, will also deplete the outer surface of the component.

Furthermore, the depletion step may be carried out by adding to the furnace any number of the following constituents in any combination or ratios: hydrogen fluoride, fluorine, hydrogen, polytetrafluoroethylene resin, helium, argon, nitrogen, chromium fluoride, ammonium fluoride, methane or any fluorocarbon or hydrocarbon. The additions of various constituents, combinations thereof or ratios thereof, may be changed continuously or at any distinct time during the processing of the component and/or at any temperature to optimize the effects of depletion. An additional vacuum heat treatment may be carried out afterwards to remove residual metal fluorides.

The depletion step may also be carried out so as to also yield a solution and/or precipitation hardening heat treatment for the component.

The component surface may also be chemically or mechanically cleaned after the depletion process in order to remove any residual salts or other contaminants. However, the depleted surface layer must not be removed which would occur, for example, by grit blasting.

The coating operation will take place directly on the depleted layer.

If there are inner cooling passages in the component, they may be shielded from the gases used to deplete the surface so that there is no depletion of the Al, Cr or Ti from the inner cooling passage surfaces. This is especially desirable when the inner surfaces are aluminized or otherwise treated for environmental resistance.

The advantage of the present invention is that, due to the initial depletion of gamma prime forming elements in the surface layer of the component, there will be a minimization or elimination of the continuous banding of gamma prime in the interdiffusion zone during the diffusion heat treatment and/or during the service life of the component. It is also expected that due to this special preparation, coatings having higher than normal Al contents may be used, leading to longer coating lives approaching those of the lifetime of the component itself, which may make costly re-coating operations unnecessary.

The process is also applicable when renewing the coating of a component whose coating has been damaged due to thermal degradation or excessive oxidation during service. After removing both the old coating and an existing "interdiffusion zone" between the base material and the coating, the process of depletion mentioned above can be applied. Protective coatings can be removed chemically by the methods disclosed, for example, in U.S. Pat. No. 5,071,486. Another way to remove the old coating is to strip it chemically with hydrochloric acid (HCl), or by mechanical means, e.g. water jets, high speed machining, etc.

What is claimed is:

1. A process for treating the surface of a component prior to applying a coating, wherein the component is a newly manufactured part which comprises a Ni based superalloy, and both the component and the coating include the elements Al and/or Cr, the process comprising steps of:

depleting the surface of the component of any one or a combination of Al, Ti, or Cr;

wherein the component has not been coated prior to the depleting step; and applying the coating directly on the depleted surface.

2. The process of claim 1, wherein the surface of the component is depleted to a depth of 500 μm.

3. The process of claim 2, wherein the surface of the component is depleted to a depth of at least 20 μm but no more than 200 μm.

4. The process of claim 1, wherein the coating comprises a MCrAlY alloy.

5. The process of claim 1, wherein the component comprises inner cooling passages and wherein the inner cooling passages are shielded during the depleting step such that there is no depletion of Al, Cr or Ti from the inner cooling passage surfaces during the depleting step.

6. The process of claim 1, wherein the component has a reduced tendency to form semi-continuous bands of a gamma prime phase in an interdiffusion zone beneath the coating during subsequent heat treatments or exposure to elevated temperatures during service.

7. The process of claim 1, wherein the depleting step includes exposing the surface of the component to reactive ions.

8. The process of claim 7, wherein the reactive ions comprise fluoride ions.

9. A process for treating the surface of a component prior to applying a coating, wherein the component comprises a Ni based superalloy, and both the component and the coating include the elements Al and/or Cr, the process comprising steps of:

removing a prior coating and an existing interdiffusion zone between the prior coating and the component;

subsequent to the removing step, depleting the surface of the component of any one or a combination of Al, Ti, or Cr; and applying the coating directly on the depleted surface.

10. The process of claim 9, wherein the prior coating has been damaged due to thermal degradation or excessive oxidation during service.

11. The process of claim 9, wherein the prior coating is removed chemically or mechanically.

12. The process of claim 9, wherein the prior coating is removed by a method selected from the group consisting of chemical stripping, water jet treatment and high-speed machining.

13. A process for treating the surface of a component prior to applying a coating, wherein the component comprises a Ni based superalloy, and both the component and the coating include the elements Al and/or Cr, the process comprising steps of:

depleting the surface of the component of any one or a combination of Al, Ti, or Cr; and applying the coating directly on the depleted surface;

wherein the component undergoes a solution and/or precipitation hardening heat treatment during the depleting step.

14. A process for treating the surface of a component prior to applying a coating, wherein the component comprises a Ni based superalloy, and both the component and the coating include the elements Al and/or Cr, the process consisting essentially of the steps of:

depleting the surface of the component of any one or a combination of Al, Ti, or Cr; and applying the coating directly on the depleted surface.

* * * * *